United States Patent
Darland

(10) Patent No.: US 10,334,760 B1
(45) Date of Patent: Jun. 25, 2019

(54) SYSTEM AND METHOD FOR HELICAL COOLING TOWER FOR EFFICIENT COOLING

(71) Applicant: Jed A. Darland, Bellevue, WA (US)

(72) Inventor: Jed A. Darland, Bellevue, WA (US)

( * ) Notice: Subject to any disclaimer, the term of this patent is extended or adjusted under 35 U.S.C. 154(b) by 0 days.

(21) Appl. No.: 15/870,062

(22) Filed: Jan. 12, 2018

(51) Int. Cl.
| H05K 7/02 | (2006.01) |
| H05K 7/14 | (2006.01) |
| H05K 7/20 | (2006.01) |
| H05K 7/18 | (2006.01) |

(52) U.S. Cl.
CPC ....... H05K 7/20736 (2013.01); H05K 7/1489 (2013.01); H05K 7/1492 (2013.01); H05K 7/20836 (2013.01)

(58) Field of Classification Search
CPC ............. H05K 7/20736; H05K 7/1489; H05K 7/1492; H05K 7/20836
See application file for complete search history.

(56) References Cited

U.S. PATENT DOCUMENTS

| 5,063,475 | A | * | 11/1991 | Balan | G06F 1/20 165/80.3 |
| 5,150,279 | A | * | 9/1992 | Collins | G06F 1/184 361/679.53 |
| 5,889,651 | A | * | 3/1999 | Sasaki | G01R 31/2891 165/908 |
| 5,937,202 | A | * | 8/1999 | Crosetto | G06F 15/803 712/11 |
| 6,134,107 | A |   | 10/2000 | Kerrigan et al. | |
| 6,874,684 | B1 | * | 4/2005 | Denenberg | B65G 1/045 235/381 |
| 7,819,667 | B2 | * | 10/2010 | Kowalski | H01R 13/514 439/65 |
| 8,189,345 | B2 | * | 5/2012 | Rapp | H05K 7/1442 361/747 |
| 8,469,228 | B2 | * | 6/2013 | Adams | G07F 7/0609 211/129.1 |
| 8,867,204 | B1 | * | 10/2014 | Gardner | H05K 7/1497 361/679.46 |
| 2002/0018339 | A1 | * | 2/2002 | Uzuka | G06F 1/184 361/796 |
| 2003/0172205 | A1 | * | 9/2003 | Bastian | G06C 15/00 710/45 |

(Continued)

OTHER PUBLICATIONS

Notification of International Search Report dated Apr. 8, 2019; PCT Application No. PCT/US19/12070, filed Jan. 2, 2019; pp. 1-3.

Primary Examiner — James Wu
Assistant Examiner — Michael A Matey
(74) Attorney, Agent, or Firm — FisherBroyles LLP; Kevin D. Jablonski

(57) ABSTRACT

Systems, apparatuses, and methods for realizing more efficient cooling for a set of computing components that may be operating as a part of a server farm in a helical structure of computing components. Arranging a rack of computing components in a helical pattern situated about a central axis member allows for helical and/or vortical air flow throughout the helical stack of racks. The airflow may be enhanced using large fans as part of an exhaust system located above the exhaust vents or situated below each stack of racks of computing components thereby increasing air flow across all computing components and dissipating heat at a faster rate.

19 Claims, 5 Drawing Sheets

(56) References Cited

U.S. PATENT DOCUMENTS

| | | |
|---|---|---|
| 2006/0131008 A1 | 6/2006 | Ogawa |
| 2007/0064383 A1* | 3/2007 | Tanaka .................... G06F 1/181 |
| | | 361/679.33 |
| 2011/0013667 A1* | 1/2011 | Merrow ................ G01K 1/146 |
| | | 374/141 |
| 2012/0033373 A1* | 2/2012 | Gilliland ............. H04B 10/803 |
| | | 361/679.32 |
| 2012/0073794 A1 | 3/2012 | Chai |
| 2013/0120931 A1* | 5/2013 | Sankar ............... H05K 7/20745 |
| | | 361/679.48 |
| 2014/0085812 A1* | 3/2014 | Ehlen ...................... H05K 1/14 |
| | | 361/679.49 |
| 2015/0129514 A1* | 5/2015 | Bourdoncle ....... H05K 7/20736 |
| | | 211/26 |
| 2017/0126505 A1* | 5/2017 | Cencini ................... H04L 67/22 |
| 2017/0147461 A1* | 5/2017 | Carmichael ......... G06F 11/2733 |
| 2018/0153059 A1* | 5/2018 | Dehlsen ............. H05K 7/20754 |

* cited by examiner

SYSTEM AND METHOD FOR HELICAL COOLING TOWER FOR EFFICIENT COOLING

BACKGROUND

The advent of the information age has led to large industrial-scale installations of server computers to handle data known as server farms. A server farm or server cluster is a collection of computer servers typically maintained by an organization to supply server functionality far beyond the capability of a single machine. Server farms often consist of thousands of computers which require a large amount of power to run and to keep cool. Server farms are typically collocated with the network switches and/or routers which enable communication between the different parts of the cluster and the users of the cluster. Server computers and all related networking equipment are typically mounted on 19-inch racks in a server room or data center.

The performance of large server farms (thousands of server computers or more) is typically limited by the performance of the associated cooling systems. Computers in server farms run continuously and consume large amounts of electricity while producing heat. For this reason, a critical design parameter for both large and continuous systems tends to be performance per watt and dissipating heat more efficiently can improve this parameter.

BRIEF DESCRIPTION OF THE DRAWINGS

Embodiments of the subject matter disclosed herein in accordance with the present disclosure will be described with reference to the drawings, in which.

Note that the same numbers are used throughout the disclosure and figures to reference like components and features.

DETAILED DESCRIPTION

Figure 1:
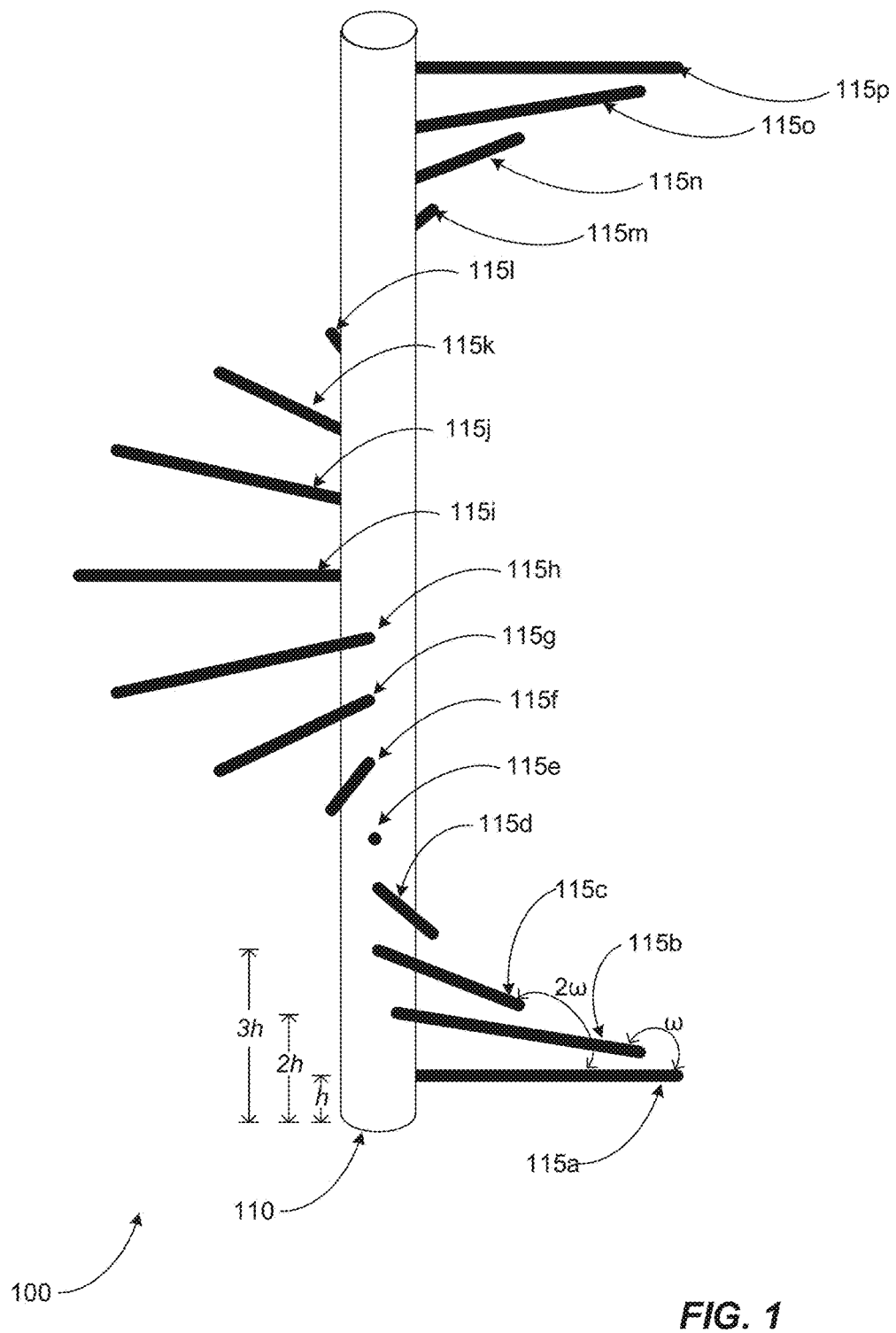
FIG. 1 is a diagram of a representation of a helical configuration of a server computer structure without racks or computing components according to an embodiment of the subject matter disclosed herein.

The subject matter of embodiments disclosed herein is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described.

Embodiments will be described more fully hereinafter with reference to the accompanying drawings, which form a part hereof, and which show, by way of illustration, exemplary embodiments by which the systems and methods described herein may be practiced. This systems and methods may, however, be embodied in many different forms and should not be construed as limited to the embodiments set forth herein; rather, these embodiments are provided so that this disclosure will satisfy the statutory requirements and convey the scope of the subject matter to those skilled in the art.

By way of overview, the systems and methods discussed herein may be directed to a system and method for more efficiently cooling a set of computing components that may be operating as a part of a server farm in a helical structure of computing components. Arranging a rack of computing components in a helical pattern situated about a central axis member allows for helical and/or vortical air flow throughout the helical stack of racks. The airflow may be enhanced using large fans as part of an exhaust ventilation system situated above or situated below each stack of racks of computing components thereby increasing air flow across all computing components and dissipating heat more efficiently and effectively at a faster rate.

In one embodiment, the helical stack may be characterized as having at least a first row of server computers disposed in a first rack mount coupled to a central axis member. The first row emanates from the central axis member in a first direction, for example horizontally from the central axis member at first reference angle. The helical stack may include a second row of server computers disposed in a second rack mount also coupled to the central axis member but at a point above the coupling of the first rack mount. The second row emanates horizontally from the central axis member in a second direction offset from the first direction, for example 30 degrees beyond the reference angle. The helical stack may include a third row of server computers disposed in a third rack mount coupled to the central axis member above the coupling of the second rack mount. The third row emanates horizontally from the central axis member in a third direction offset from the first direction and offset from the second direction, for example 30 degrees from the second angle and 60 degrees from the reference angle. The helical stack of rack mounts having multiple server computers may be further housed in silos to assist with helical and/or vortical airflow.

These and other concepts are discussed in greater detail below with respect to FIGS. 1-5.

FIG. 1 is a diagram of a representation of a helical configuration of a server computer structure 100 without racks or computing components according to an embodiment of the subject matter disclosed herein. FIG. 1 is a representation in that no server computers (or any other computing component) or mounting structures are shown in FIG. 1 as this is intended to illustrate the concept of the helical pattern of where specific mounts may be located about a central axis member 110. One can see that each of the "rods" 115a-p may be coupled to the central axis member 110 at various points that rotate about the central axis member 110. Further, each rod 115a-p is set equidistantly above a previous rod as the rods emanate in different angles around the central axis member 110. For example, rod 115a is shown as emanating horizontally from the central axis member 110 at a height of h at a reference angle that may be set as zero degrees (i.e., in a pure x direction with an x-y coordinate system set in the z direction aligned with the central axis member). Further, rod 115b is shown as emanating horizontally from the central axis member 110 at a height of 2h at a reference angle that may be set as w degrees beyond the reference angle. Further still, rod 115c is shown as emanating horizontally from the central axis member 110 at a height of 3h at a reference angle that may be set as 2ω degrees beyond the reference angle.

In FIG. 1, the rods 115a-p are simply illustrative of how a rack of computing components may be arranged about a central axis member. Variations in this configuration includes the height differences h of each rod 115a-p location as well as the angle ω in which each rod 115a-p location is situated. The "rods" 115a-p are a representation of any and all equipment required to complete a working installation at each representation 115a-115p in FIG. 1, but a skilled artisan understands that the positions and quantities are not limited that which is depicted in FIG. 1. The quantity of rack positions (as represented by "rods"), variations of length, height, repetition, iteration or position about the central axis 110 are all possible embodiments.

Further, the rod 115a-p locations and orientations are shown as emanating substantially horizontally from the central axis member 110. In other embodiments, the emanation angle may deviate up or down from the horizontal embodiment shown in FIG. 1. That is, the rods 115a-p (e.g., the racks of computing components) may be angled up or down as required or desired with respect to a required or desired direction from the central axis member 110.

Figure 2:
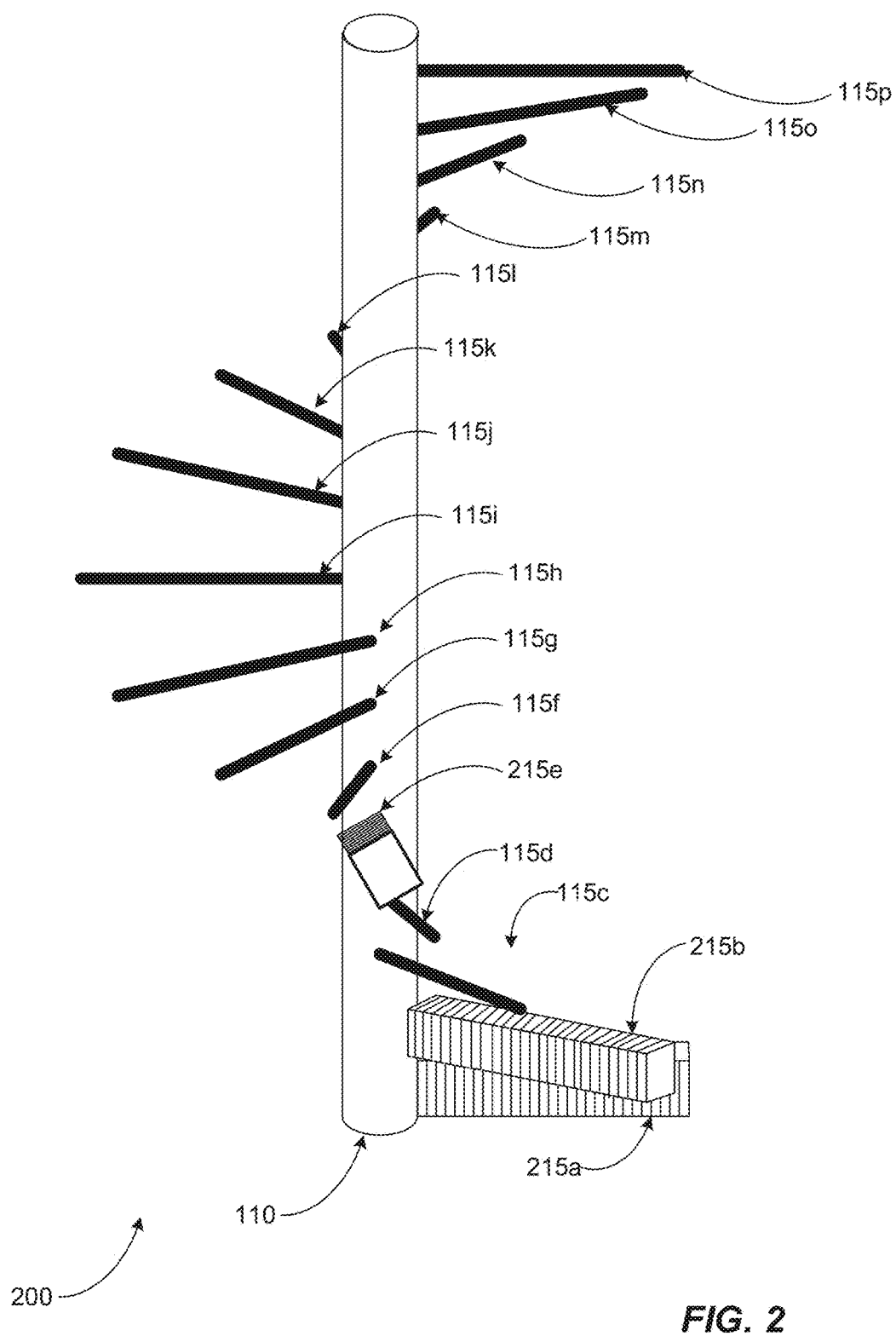
FIG. 2 is a diagram of a helical configuration of a server computer structure with some racks of computing components according to an embodiment of the subject matter disclosed herein.

As discussed below, each rod 115a-p may represent a mount position for a rack or server computers or other computing components such as CPUs, power management components, server blades, and networking components, that may be respectively coupled via a communicative coupling to a computer network (not shown in FIG. 1). Further, each server computer may also be coupled to a power source (also not shown in FIG. 1) so as to provide power to the server computers in each rack. FIG. 2 shows aspects of these couplings and the rack mounts.

FIG. 2 is a diagram of a helical configuration of a server computer structure 200 with some racks of computing components according to an embodiment of the subject matter disclosed herein. In this example embodiment, three racks 215a, 215b, and 215e are shown disposed about the central axis member 110 where a previous rods 115a, 115b, and 115e were shown is FIG. 1. As shown, each rack 215a, 215b, and 215e includes several computing components arranged in a rack-mounted manner, typically as part of a stab-in configuration in a standard 19-inch rack mount installation. Each of these rack location may be referred to as a propeller that is one part of the overall helical structure. Each rack (e.g., each propeller) may be statically fixed about the central axis member 110 or may be dynamically arranged thereby configured to be moved about the central axis member 110 by adjusting the vertical angle (e.g., the ω angle as shown in FIG. 1) with respect to the axis of the central axis member 110. Further, each rack (e.g., each propeller) may be also statically fixed at a specific rotation angle (as measured about an axis aligned with each rod) or may be dynamically arranged thereby configured to be rotated about a respective rod. That is, as shown in FIG. 2, the rack 215a and 215b are shown as having zero rotation angle, but rack 215e is shown as being rotated away from the zero rotation angle about its respective rod position.

Each rack may include a backplane suited to receive various rack-mountable components and suited to distribute communication signals as well as power signals to and from each rack-mounted component. Such a rack may further provide integrated shelf support that includes integrated communications switching gear, hubs, and other connectivity devices such as RJ-45 jacks, Ethernet ports, multi-pin connectors, bus bars, circuit breakers, and other power outlets and ports.

The embodiment of FIG. 2, then, necessarily includes a first row of computing components disposed in a first mount 215a coupled to the central axis member 110. The first row 215a emanates from the central axis member 110 in a first direction characterized as normal to the central axis member (e.g., horizontally) and at a reference angle of zero degrees (with respect to an x-y coordinate system situated with respect to the vertical y-direction of the central axis member 110. This embodiment includes a second row 215b of computing components disposed in a second mount 215b coupled to the central axis member 110 above the coupling of the first mount 215a. The second row 215b emanates from the central axis member 110 in a second direction offset from the first direction. As shown this offset is approximately 30 degrees by may set to any meaningful differentiation from the reference angle so as to assist with facilitating helical and/or vortical airflow. This embodiment further includes a third row 215e of computing components disposed in a third mount 215e coupled to the central axis member 110 above the coupling of the second mount 215b. As shown here, the third mount is shown skipping mounts where racks would typically be located at mount 115c and 115d. Again, the third row 215e emanates from the central axis member 110 in a third direction offset from the first direction and offset from the second direction. In this case of the mount 215e, the offset is 90 degrees from the first direction. The offsets may be any suitable offset to facilitate helical and/or vortical airflow (e.g., the offsets produce a helical pattern of racks.

In another embodiment not shown in FIG. 2, additional reciprocal racks of computing components may be disposed opposite the set of rack-mount positions shown in FIG. 2. That is, for each rack-mount position (rods 115a-115p in FIG. 1, a respective rack of computing components may be disposed at the equivalent height, but emanating in the opposite direction from the respective rack (e.g., offset 180 degrees from the respective reciprocal rack). In this manner, the helical pattern created is a double helical pattern.

Figure 3:
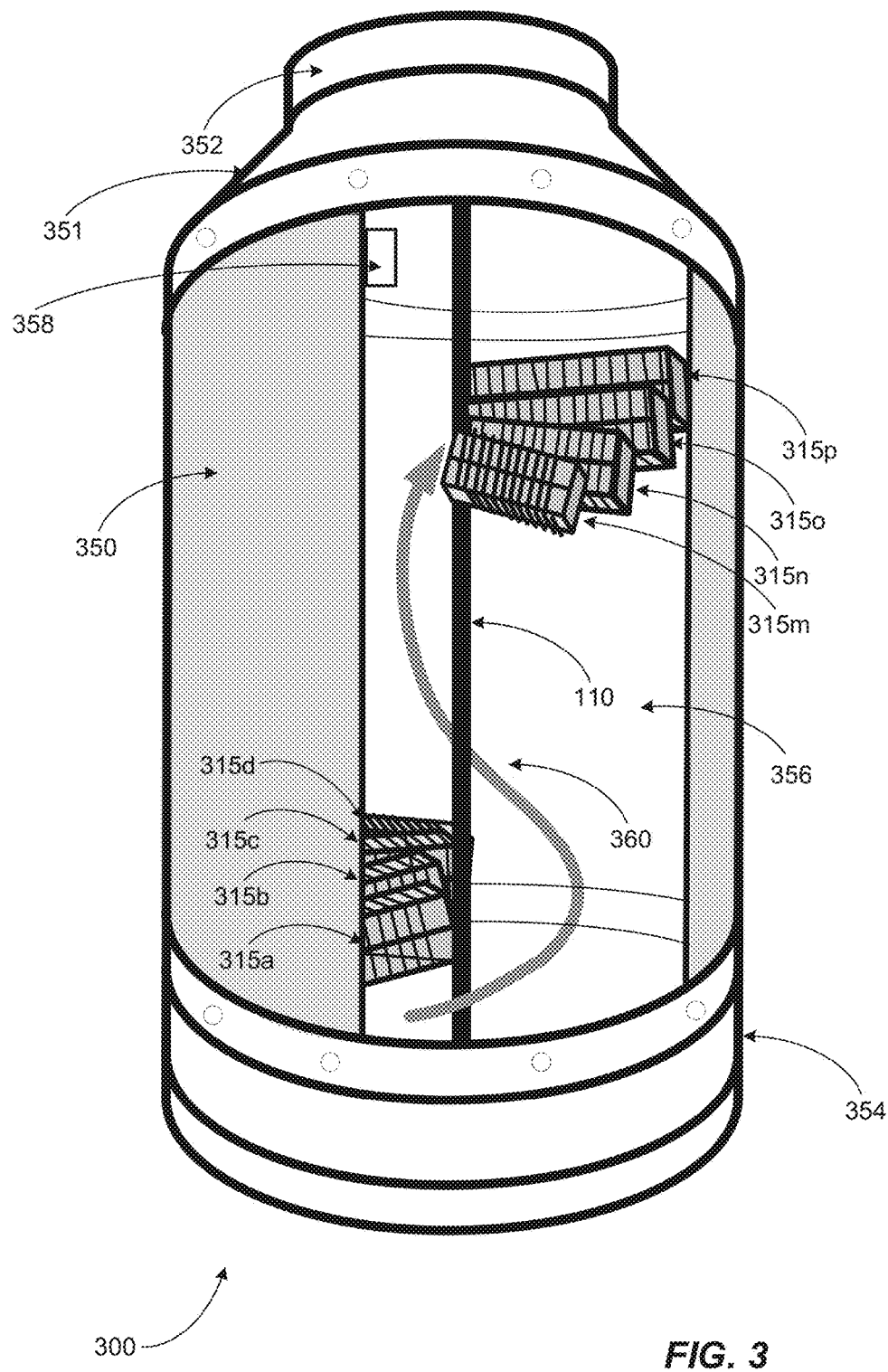
FIG. 3 is a diagram of a helical configuration of a server computer structure having an enclosure with computing components according to an embodiment of the subject matter disclosed herein.

FIG. 3 is a diagram of a helical configuration of a server computer structure 300 having an enclosure 350 with computing components according to an embodiment of the subject matter disclosed herein. As shown, the helical structure of computing components arranged in racks (only racks 315a-d and 315m-p are shown in FIG. 3) about a central axis member 110 is shown inside an enclosure 350. The enclosure 350 may be a silo having a cylindrical shape with or without a tapered top 351. In other embodiments, the enclosure may be elliptical. The tapered top 351, shown in this embodiment, with a fixed taper at approximately 45 degrees culminates at a circular vent 352 for venting air that is flowing vertically inside the enclosure 350. Several variations in different embodiments are contemplated. The top 351 may be parabolic, conical, cylindrical, or even non-existent. Further, the vent 352 may vary just as much is shape and contour. The enclosure may be mounted on a base 354 having intake vents to facilitate airflow and mounted in a fixed manner or in a manner that facilitates rotational movement. The silo-like enclosure assist with facilitating helical and/or vortical air flow as illustrated by arrow 360. Thus, air will flow helically and/or vortically through the helical structure of racks affixed about the central axis member 110 from the bottom near the base 354 to the top and out the vent 352.

This helical and/or vortical airflow creates a better environment for dissipating heat from the computing components in the racks as air flow is increased across each individual components when compared to conventional aligned rack stacking. Further, the helical and/or vortical airflow is more evenly distributed across all racks with such a helical arrangement of racks. The racks may be arranged with specific offset angles to increase or decrease the speed of helical and/or vortical airflow inside the enclosure 350. The height of the enclosure 350 may be tailored to ensure that an the operating temperature of the ambient air inside the enclosure 350 will remain below a threshold temperature. Further, dimensions of the base (e.g., the size and location of intake vents) may be a function of the net free area necessary to cool the enclosed computer components.

The enclosure 350 may be clad with an opaque, transparent, and/or translucent material or a combination of such materials. Further, the side of the enclosure 350 may be movable, removable, rotateable, glideable, slideable, or otherwise moveable to allow for service of the equipment within. Thus, an opening 356 may be able to be accessed by sliding the cladding of a side of the enclosure 250 aside. One or more large fans (not shown in FIG. 3) may be located in the base 354 and actuated to produce helical and/or vortical airflow in the direction of arrow 360. In other embodiments, the one or more fans may be located in the vent 352 or is a plenum (not shown in FIG. 3) above the enclosure 250. The one or more fans as part of an exhaust ventilation system, or shared exhaust plenum may be actuated in response to detection of ambient temperature meeting or exceeding a threshold temperature using a temperate sensor 358 which may be located within the enclosure (as shown) or within the exhaust ventilation system or shared exhaust plenum (not shown).

Figure 4:
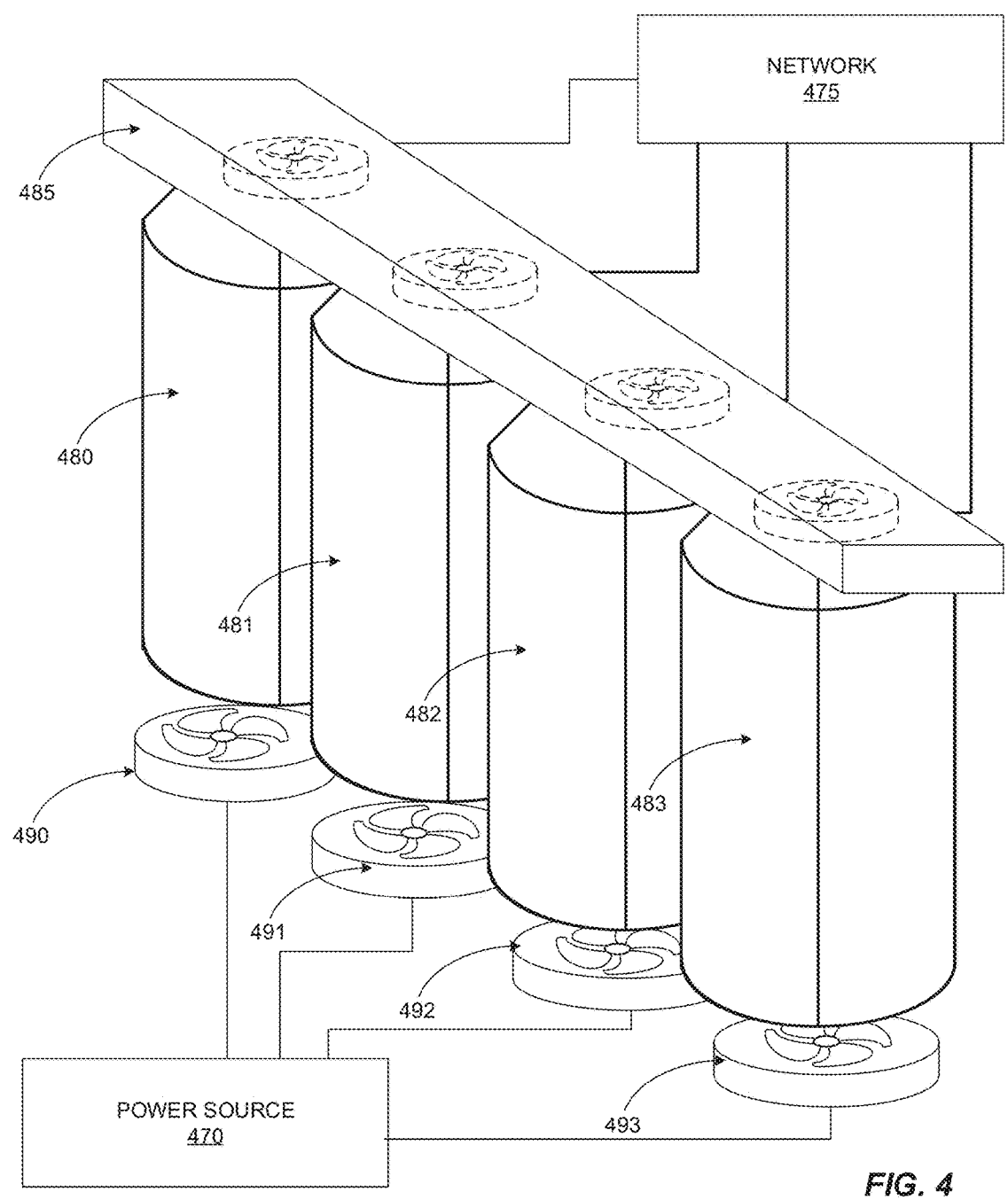
FIG. 4 is a diagram of a server farm having several server enclosures according to an embodiment of the subject matter disclosed herein.

FIG. 4 is a diagram of a server farm 400 having several server enclosures according to an embodiment of the subject matter disclosed herein. As shown, the server farm 400 includes four enclosures 480, 481, 482 and 483 that are similar to the enclosure 350 as described above with respect to FIG. 3. Each enclosure includes a communicative coupling to a computer network 475 such that any enclosed computing components may access and interact with the computer network 475. Each enclosure 480, 481, 482 and 483 in FIG. 4 is associated with a respective fan 490, 491, 492 and 493 shown mounted below the system that may assist with facilitating helical and/or vortical airflow through each enclosure 480, 481, 482 and 483. Each fan 490, 491, 492 and 493 may be coupled to a power source 470 that also provide power to respective computing components within each enclosure 480, 481, 482 and 483. In other embodiments, the fans 490, 491, 492 and 493 may be mounted above each respective enclosure 480, 481, 482 and 483 in addition to below or instead of below and may be located within a common plenum 485 or as part of an integral exhaust ventilation system. The plenum 485 may be a common plenum as shown or may be compartmentalized plenums adjacent to each exhaust vent, Further, the common or divided plenum 485 may be isolated form intake air from below.

Figure 5:
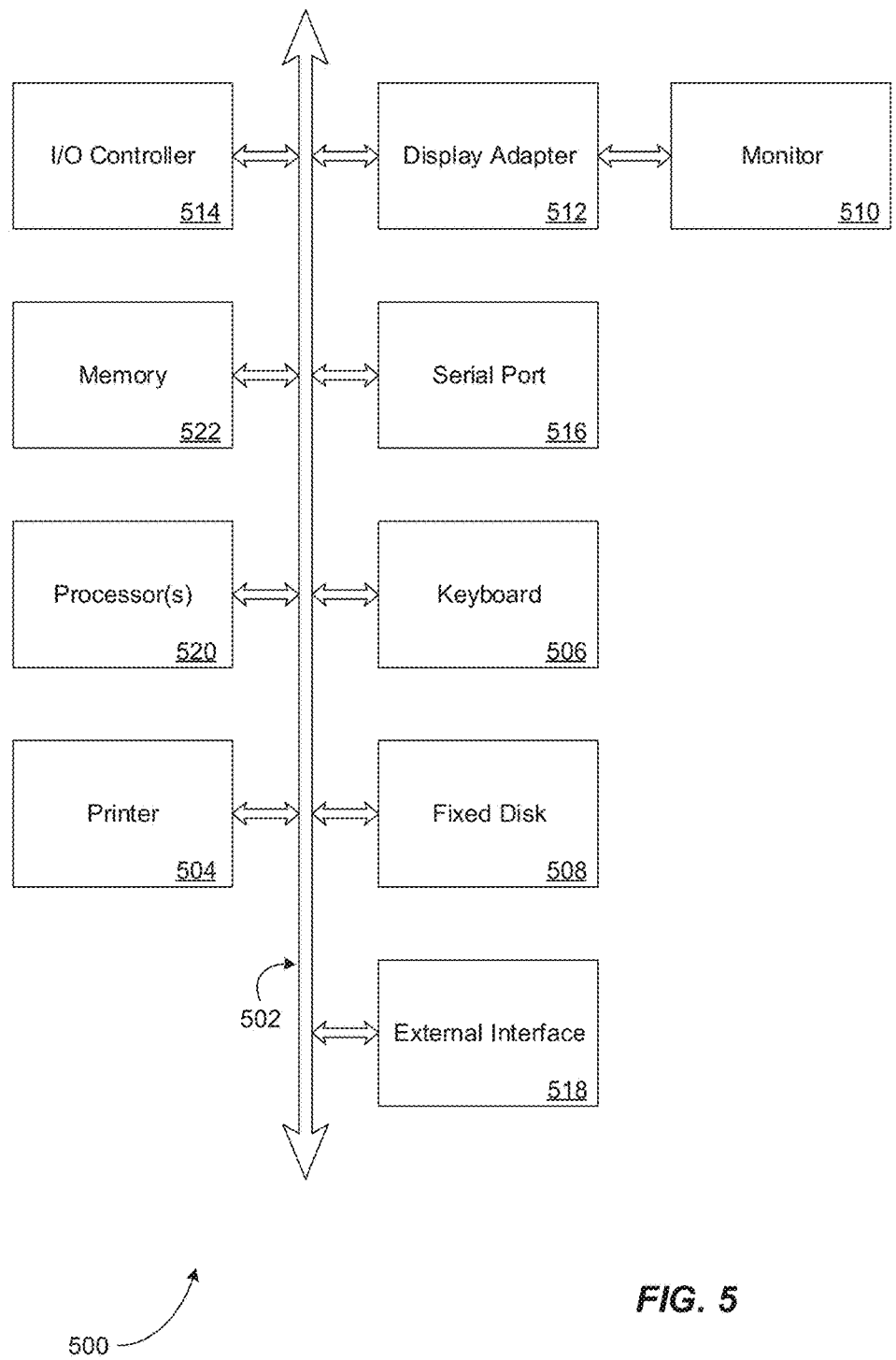
FIG. 5 is a diagram illustrating elements or components that may be present in any computing component within any rack of any enclosure in accordance with an embodiment.

FIG. 5 is a diagram illustrating elements or components that may be present in any computing component within any rack of any enclosure in accordance with an embodiment. In accordance with one or more embodiments, the system, apparatus, methods, processes, functions, and/or operations for enabling efficient configuration and presentation of a user interface to a user based on the user's previous behavior may be wholly or partially implemented in the form of a set of instructions executed by one or more programmed computer processors such as a master control unit (MCU), central processing unit (CPU), or microprocessor. Such processors may be incorporated in an apparatus, server, client or other computing or data processing device operated by, or in communication with, other components of the system. As an example, FIG. 5 is a diagram illustrating elements or components that may be present in a computer device or system 500 configured to implement a method, process, function, or operation in accordance with an embodiment. The subsystems shown in FIG. 5 are interconnected via a system bus 502. Additional subsystems include a printer 504, a keyboard 506, a fixed disk 508, and a monitor 510, which is coupled to a display adapter 512. Peripherals and input/output (I/O) devices, which couple to an I/O controller 514, can be connected to the computer system by any number of means known in the art, such as a serial port 516. For example, the serial port 516 or an external interface 518 can be utilized to connect the computer device 500 to further devices and/or systems not shown in FIG. 5 including a wide area network such as the Internet, a mouse input device, and/or a scanner. The interconnection via the system bus 502 allows one or more processors 520 to communicate with each subsystem and to control the execution of instructions that may be stored in a system memory 522 and/or the fixed disk 508, as well as the exchange of information between subsystems. The system memory 522 and/or the fixed disk 508 may embody a tangible computer-readable medium.

It should be understood that the present disclosures as described above can be implemented in the form of control logic using computer software in a modular or integrated manner. Based on the disclosure and teachings provided herein, a person of ordinary skill in the art will know and appreciate other ways and/or methods to implement the present disclosure using hardware and a combination of hardware and software.

Any of the software components, processes or functions described in this application may be implemented as software code to be executed by a processor using any suitable computer language such as, for example, Assembly language Java, JavaScript, C, C++ or Perl using, for example, conventional or object-oriented techniques. The software code may be stored as a series of instructions, or commands on a computer readable medium, such as a random-access memory (RAM), a read only memory (ROM), a magnetic medium such as a hard-drive or a thumb drive, or an optical medium such as a CD-ROM. Any such computer readable medium may reside on or within a single computational apparatus, and may be present on or within different computational apparatuses within a system or network.

All references, including publications, patent applications, and patents, cited herein are hereby incorporated by reference to the same extent as if each reference were individually and specifically indicated to be incorporated by reference and/or were set forth in its entirety herein.

The use of the terms "a" and "an" and "the" and similar referents in the specification and in the following claims are to be construed to cover both the singular and the plural, unless otherwise indicated herein or clearly contradicted by context. The terms "having," "including," "containing" and similar referents in the specification and in the following claims are to be construed as open-ended terms (e.g., meaning "including, but not limited to,") unless otherwise noted.

Recitation of ranges of values herein are merely indented to serve as a shorthand method of referring individually to each separate value inclusively falling within the range, unless otherwise indicated herein, and each separate value is incorporated into the specification as if it were individually recited herein. All methods described herein can be performed in any suitable order unless otherwise indicated herein or clearly contradicted by context. The use of any and all examples, or exemplary language (e.g., "such as") provided herein, is intended merely to better illuminate embodiments and does not pose a limitation to the scope of the disclosure unless otherwise claimed. No language in the specification should be construed as indicating any non-claimed element as essential to each embodiment of the present disclosure.

Different arrangements of the components depicted in the drawings or described above, as well as components and steps not shown or described are possible. Similarly, some features and sub-combinations are useful and may be employed without reference to other features and sub-combinations. Embodiments have been described for illustrative and not restrictive purposes, and alternative embodiments will become apparent to readers of this patent. Accordingly, the present subject matter is not limited to the embodiments described above or depicted in the drawings, and various embodiments and modifications can be made without departing from the scope of the claims below.

That which is claimed is:

1. A computing structure, comprising: a first row of computing components disposed in a first mount coupled to a central axis member, the first row emanating from the central axis member in a first direction; a second row of computing components disposed in a second mount coupled to the central axis member above the coupling of the first mount, the second row emanating from the central axis member in a second direction offset from the first direction; and a third row of computing components disposed in a third mount coupled to the central axis member above the coupling of the second mount, the third row emanating from the central axis member in a third direction offset from the first direction and offset from the second direction, wherein the first row, the second row, and the third row are part of a helical pattern of rows of computing components configured about the central axis member.

2. The computing structure of claim 1, further comprising:
a fourth row of computing components disposed in a fourth mount coupled to the central axis member, the fourth row emanating from the central axis member in the fourth direction;
a fifth row of computing components disposed in a fifth mount coupled to the central axis member above the coupling of the fourth mount, the fifth row emanating from the central axis member in a fifth direction offset from the fourth direction; and
a sixth row of computing components disposed in a sixth mount coupled to the central axis member above the coupling of the fifth mount, the sixth row emanating from the central axis member in a sixth direction offset from the fourth direction and offset from the fifth direction.

3. The computing structure of claim 2, wherein: the first direction is opposite the fourth direction; the second direction is opposite the fifth direction; and the third direction is opposite the sixth direction.

4. The computing structure of claim 1, further comprising a communicative coupling between each computing component and a computer network.

5. The computing structure of claim 1, further comprising a power coupling between each computing component and a power source.

6. The computing structure of claim 1, wherein each mount comprises a 19-inch rack suitable to support a plurality of 19-inch rack-mountable components.

7. The computing structure of claim 1, wherein each row emanates substantially horizontally from the central axis member.

8. The computing structure of claim 1, wherein each offset is approximately 30 degrees.

9. The computing structure of claim 1, wherein the first row, the second row, and the third row are part of a double helical pattern of rows of computing components configured about the central axis member.

10. A server farm structure, comprising: an enclosure having a central cavity with a central axis member; a first row of computing components disposed in a first mount coupled to a central axis member, the first row emanating from the central axis member in a first direction; a second row of computing components disposed in a second mount coupled to the central axis member above the coupling of the first mount, the second row emanating from the central axis member in a second direction offset from the first direction; and a third row of computing components disposed in a third mount coupled to the central axis member above the coupling of the second mount, the third row emanating from the central axis member in a third direction offset from the first direction and offset from the second direction, wherein the first row, the second row, and the third row are part of a helical pattern of rows of computing components configured about the central axis member.

11. The server farm structure of claim 10, further comprising a fan disposed adjacent the enclosure and configured to force ambient air past each row of server computers in a helical and/or vortical manner.

12. The server farm structure of claim 11, further comprising:
an ambient air temperature sensor configured to detect ambient air temperature in the central enclosure; and
a power source coupled to the fan and configured to operate the fan in response to detecting ambient air temperature at or beyond a threshold temperature.

13. The server farm structure of claim 10, wherein the enclosure comprises a cylindrical silo having a tapered top with a centrally disposed vent.

14. The server farm structure of claim 10, wherein the enclosure comprises a removeable covering disposed on a side of the enclosure configured to allow access to the computing components.

15. The server farm structure of claim 10, wherein the rows of computing components comprises interchangeable and movable rows.

16. The server farm structure of claim 10, wherein each computing component is coupled to a computer network.

17. A method of cooling equipment, comprising: disposing a plurality of computing devices emanating from a central axis member in a helical pattern inside a silo; forcing a flow of air through the helical pattern of the plurality of computing devices; and dissipating heat away from the plurality of computing devices through an exhaust vent disposed at the top of the silo.

18. The method of claim 17, wherein forcing the flow of air further comprises actuating a fan disposed adjacent the silo to induce a vortical flow of air.

19. The method of claim 17, wherein the actuation of the fan comprises actuating the fan in response to detecting an ambient temperature exceeding a threshold temperature.

\* \* \* \* \*